(12) United States Patent
Guo

(10) Patent No.: US 11,399,237 B2
(45) Date of Patent: Jul. 26, 2022

(54) MEMS ACOUSTIC SENSOR AND ASSEMBLY

(71) Applicant: Knowles Electronics, LLC, Itasca, IL (US)

(72) Inventor: Zhijun Guo, Buffalo Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/137,678

(22) Filed: Dec. 30, 2020

(65) Prior Publication Data

US 2022/0210580 A1 Jun. 30, 2022

(51) Int. Cl.
*H04R 19/00* (2006.01)
*H04R 19/04* (2006.01)
*B81B 3/00* (2006.01)
*H04R 1/04* (2006.01)
*H04R 7/06* (2006.01)
*H04R 7/16* (2006.01)

(52) U.S. Cl.
CPC ........... *H04R 19/04* (2013.01); *B81B 3/0021* (2013.01); *H04R 1/04* (2013.01); *H04R 7/06* (2013.01); *H04R 7/16* (2013.01); *B81B 2201/0257* (2013.01); *B81B 2203/0127* (2013.01); *B81B 2203/04* (2013.01); *B81B 2207/012* (2013.01)

(58) Field of Classification Search
CPC . H04R 19/04; H04R 1/04; H04R 7/06; H04R 7/16; B81B 3/0021; B81B 2201/0257; B81B 2203/0127; B81B 2203/04; B81B 2207/012
See application file for complete search history.

(56) References Cited

U.S. PATENT DOCUMENTS

| 10,362,408 | B2 | 7/2019 | Kuntzman | |
| 2018/0146296 | A1 | 5/2018 | Meisel | |
| 2019/0352176 | A1* | 11/2019 | Doller | .................. H04R 19/005 |

(Continued)

FOREIGN PATENT DOCUMENTS

WO    2020106637    5/2020

OTHER PUBLICATIONS

Naderyan, U.S. Appl. No. 17/037,959, U.S. Patent and Trademark Office, filed Sep. 30, 2020.

(Continued)

*Primary Examiner* — Matthew A Eason
(74) *Attorney, Agent, or Firm* — Loppnow & Chapa; Matthew C. Loppnow

(57) ABSTRACT

The disclosure relates to a MEMS sensor and an assembly including the MEMS sensor and an electrical circuit disposed in an assembly housing. The sensor includes a suspended structure (148) having a top diaphragm (118), a central electrode (120) and a bottom diaphragm (122) connected by a pillar portion (134). A peripheral portion of the suspended structure is coupled to a support structure (114), forming a low pressure cavity (130). The MEMS sensor includes a top electrode (136) disposed between the top diaphragm and the central electrode and a bottom electrode (138) disposed between the bottom diaphragm and central electrode each coupled to the support structure, wherein in the event of a sound pressure condition, the suspended structures moves up or down together, while the top electrode and the bottom electrode remain substantially stationary.

18 Claims, 4 Drawing Sheets

(56) References Cited

U.S. PATENT DOCUMENTS

2019/0389721 A1\* 12/2019 Doller ................ B81B 3/0021
2020/0112799 A1   4/2020 Kuntzman
2021/0029470 A1   1/2021 Nawaz

OTHER PUBLICATIONS

Nawaz, U.S. Appl. No. 17/117,073, U.S. Patent and Trademark Office, filed Dec. 9, 2020.
Loeppert, U.S. Appl. No. 17/111,465, U.S. Patent and Trademark Office, filed Dec. 3, 2020.
Chandrasekaran U.S. Appl. No. 17/127,794, U.S. Patent and Trademark Office, filed Dec. 18, 2020.
Loeppert, U.S. Appl. No. 17/133,506, U.S. Patent and Trademark Office, filed Dec. 23, 2020.

\* cited by examiner

MEMS ACOUSTIC SENSOR AND ASSEMBLY

FIELD OF THE DISCLOSURE

The present disclosure relates generally to MEMS sensors and more particularly to MEMS sensors assemblies and MEMS dies for such assemblies.

BACKGROUND

MEMS sensors are often deployed in various electronic devices such as cellular phones, mobile devices, headsets, hands free systems, smart televisions, smart speakers, portable computers, etc. Such microphones typically include a transducer disposed within a housing, for converting sound waves into an electrical signal that represents the sound. Generally, temperature changes, radiation and other conditions external to the microphone can cause thermo-acoustic effects (e.g., temperature and air pressure changes) within the housing. In wireless communication devices, for example, some radio frequencies induce thermal-acoustic effects in microphones integrated with the device.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
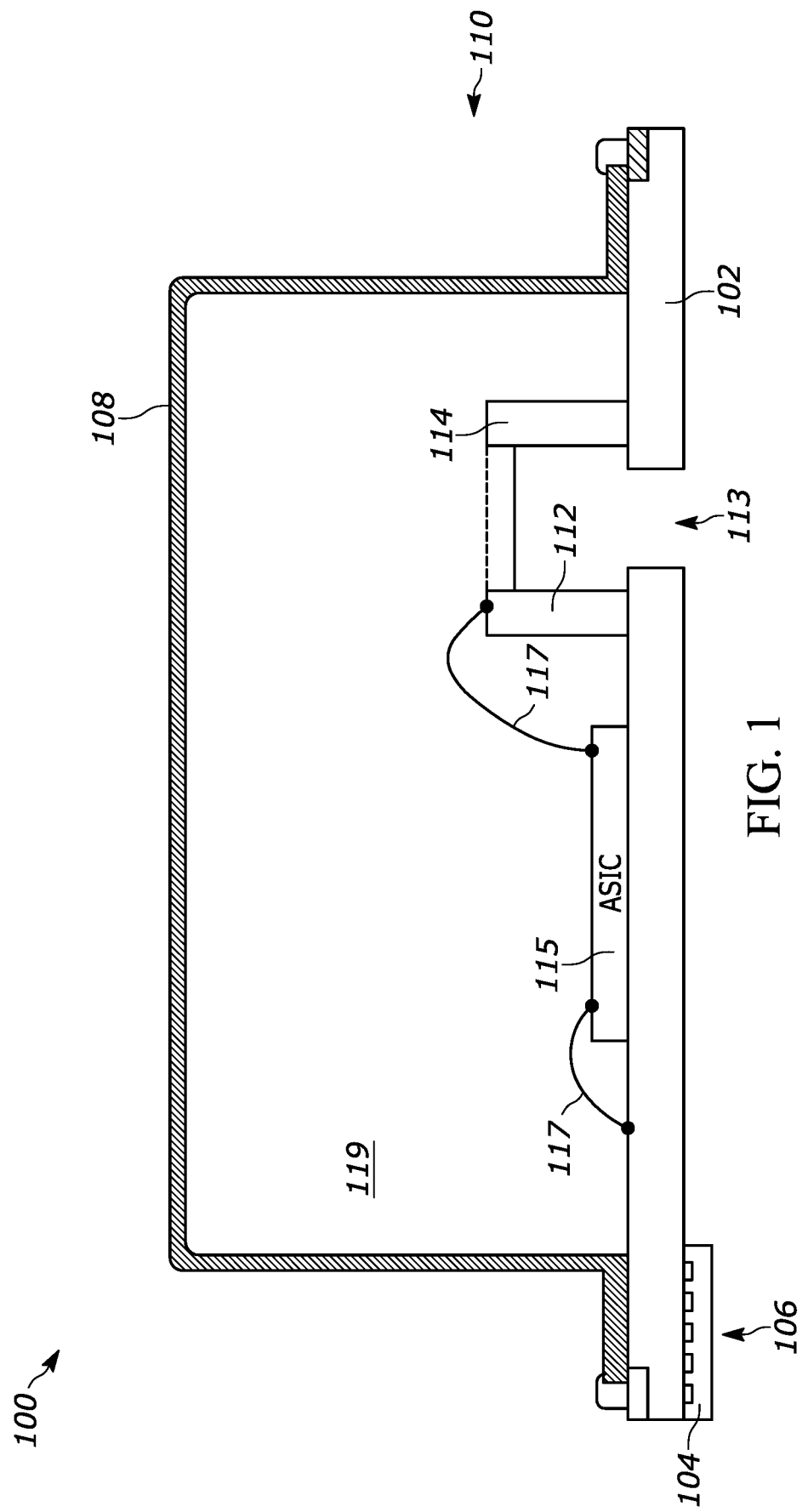
FIG. 1 is a side cross-sectional view of an acoustic transducer assembly in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes MEMS sensors and assemblies. The acoustic industry and its engineers are searching for ways and designs to provide enhanced sensitivity and sound quality in a robust structure. MEMS sensors and assemblies generally comprise a transduction element disposed within a housing and configured to generate an electrical signal representative of a sensed condition for output to an integrated circuit of the sensor assembly. MEMS sensors and assemblies can be implemented as an acoustic sensor, a vibration sensor, a pressure sensor, a temperature sensor, or a humidity sensor, among others, and combinations thereof.

MEMS sensors and assemblies are described below but the teachings are applicable to other types of sensors described herein. The MEMS acoustic sensor assembly can include a transduction element, an integrated circuit (IC), and a housing. The housing can enclose the transducer and the integrated circuit. The transducer can convert a sound into a signal electrically representing the sound and provide the electrical signal to the IC. The IC can process (e.g., amplify, buffer, filter, digitize, etc.) the signal and output a processed signal at an external-device (e.g., host) interface of the sensor assembly. The housing generally protects and isolates the transducer and the IC from the effects of RF energy on the performance of the transducer assembly. The IC may output the processed audio signal to an external electrical device or host.

Referring to FIG. 1, an embodiment of an acoustic transducer assembly (ATA) 100 is shown. In its simplest form, the ATA 100 includes: a base 102 (e.g., a substrate, such as a printed circuit board (PCB)) having a host-device interface 104 with for example a plurality of contacts 106; a lid 108 mounted on the base 102 to form an assembly housing 110, a MEMS sensor 112, disposed in the assembly housing and acoustically coupled to a sound port of the assembly housing, a sound port 113, IC 115 disposed in the assembly housing, lead(s) 117 to contacts 106 and MEMS sensor 112.

The ATA 100 can be integrated with a cellular phone, mobile device, headset, hearing aid device, smart television, smart speaker, or any other type of host device. In some embodiments, the ATA 100 can include additional components not shown in FIG. 1.

As should be understood by those skilled in the art, the host-device interface 104 can be a surface-mount interface or can be in the form of leads for a through-hole interface. The MEMS sensor 112 can be a capacitive, piezoresistive, resonant, or optical, among others. These and other suitable transduction elements can be fabricated as microelectromechanical systems (MEMS) devices. The sound port 113 can be located in the base 102 as shown in FIG. 1, for a bottom-port implementation, or on the lid 108 for a top-port implementation, for example. The MEMS sensor 112, such as in the form of a MEMS die, can be mounted over the sound port 113. The integrated circuit or ASIC functions can include: impedance matching (buffering) or charge sampling; filtering; amplification; A/D (for digital mics); output signal protocol formatting (e.g., PDM, Soundwire) and the like, for example. In addition, other microphones, such as "smart mics", can include a separate DSP for higher order processing like voice recognition, noise suppression and authentication. The geometric shape and size of the ATA 100, lid 108, housing 110 and MEMS sensor 112, can vary widely based on the use case. By way of example, the ATA 100, lid 108, housing 110 and MEMS sensor 112 can be generally circular, cylindrical, square, octagon, or any other polygon shape or geometry having a use case.

Figure 2:
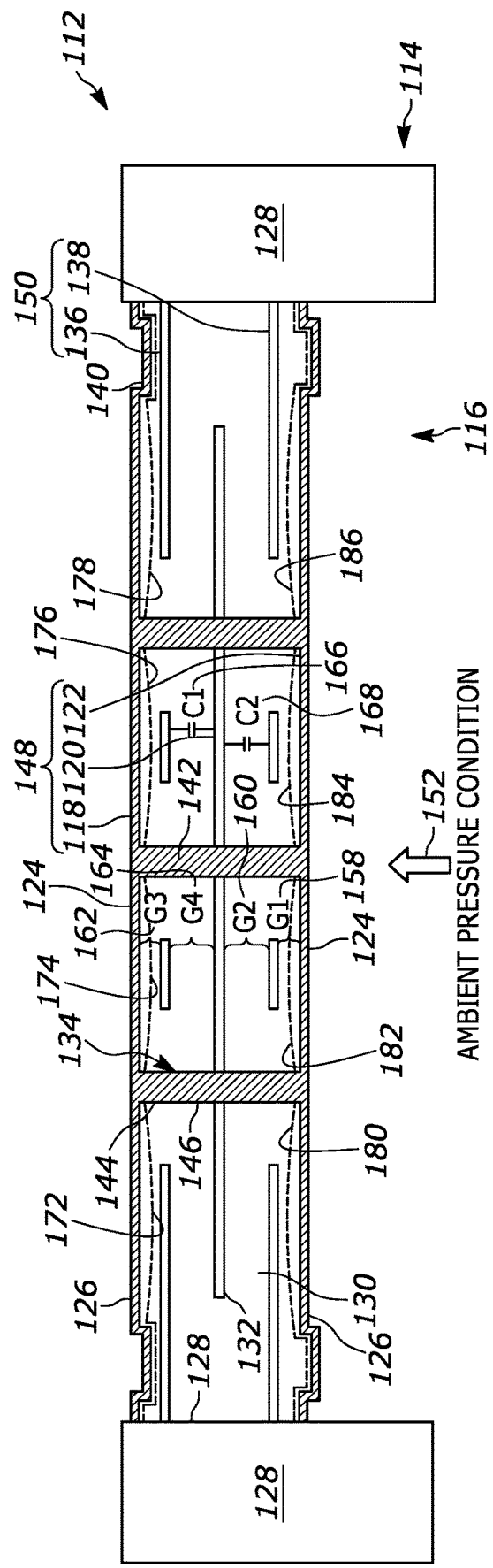
FIG. 2 is a side cross-sectional view of a MEMS acoustic sensor, in an ambient pressure condition, in accordance with an illustrative embodiment.

In FIG. 2, a MEMS die or sensor 112, in the form of an acoustic sensor in a vacuum is shown. The MEMS sensor 112 includes: a housing 114 (also referred to as a "support structure" to differentiate from the assembly housing); a transducer 116 disposed in the support structure 114, the transducer 116 including a top diaphragm 118, a central electrode 120 and a bottom diaphragm 122; the top diaphragm 118 and the bottom diaphragm 122 including a middle portion 124 and a peripheral portion 126 extending to and coupled with a wall 128 of the support structure 114, forming a low pressure cavity 130; the central electrode 120 extends along and between the middle portions 124 of the top diaphragm 118 and the bottom diaphragm 122 and includes a termination 132 point free from contacting the wall 128; the central electrode 120 is connected to the top diaphragm 118 and the bottom diaphragm 122 by a pillar structure 134, the transducer 116 further including a top electrode 136 disposed between the top diaphragm 118 and the central electrode 120 and a bottom electrode 138 disposed between the bottom diaphragm 122 and central electrode 120 each coupled to the wall 128 of the support structure 114, wherein in the event of a positive acoustic pressure condition or a negative acoustic pressure condition, the top diaphragm 118, the bottom diaphragm 122 and central electrode 120 move up or down together, while the top electrode 136 and the bottom electrode 138 remain substantially stationary. Advantageously, this construction can provide enhanced sensitivity and sound quality, a desired 3D footprint and a robust structure.

Also advantageously, in one embodiment, the top diaphragm 118, the bottom diaphragm 122 and central electrode 120 can move up/down or float, to provide improved sensitivity of the transducer 116 and are constructed to allow movement of part of the transducer 116 when exposed to sound pressures, which can provide improved sound quality.

In FIG. 2, the peripheral portions 126 of the top diaphragm 118 and the bottom diaphragm 122 include an adjacent corrugation region 140. In one embodiment, the corrugation region 140 allows part of the transducer to float during a positive or negative acoustic pressure condition, defining an independent suspension system, while another part remains stationary. The corrugation region 140 can be defined as an independent suspension system, which helps to provide compliance sufficiently high to provide high sensitivity and/or movement of a diaphragm in situations in which an acoustic transducer is exposed to sound pressures. The corrugation region should also be constructed in a smooth-shaped manner to reduce stress concentrations, to increase diaphragm robustness and reduce premature failure. In one embodiment, it should be noted, that the top and bottom electrodes 136 and 138 are fixed or coupled to the wall 128 and fail to have such a corrugation region (or independent suspension system) and thus act differently and independently from the top 118 and bottom diaphragms 122. Stated differently, the corrugation region 140, as detailed herein, can provide a compliant linkage that includes at least some of its movability and mobility being flexible while also allowing a predetermined deflection.

In FIG. 2, the pillar structure 134 includes a plurality of pillars 142 and the central electrode 120 has holes 144 configured and aligned to allow the plurality of pillars 142 to extend therethrough and connects (at connection(s) 146) to the central electrode 120. Advantageously, this structure allows and enables the tandem movement of the top diaphragm 118, the bottom diaphragm 122 and the central electrode 120, when exposed to sound pressures. In one embodiment, the pillars 142 comprise a non-conductive material.

In more detail, the central electrode 120 is constructed to move with the top diaphragm 118 and the bottom diaphragm 122. Advantageously, in one embodiment, this structure is constructed and adapted to allow the three components (the central electrode 120, the top diaphragm 118 and the bottom diaphragm 122, hereafter referred to as suspended structure 148) to move in tandem with each other when exposed to sound pressures, independent of the stationary structure 150 (top and bottom electrodes 136 and 138), which remain stationary. Stated differently, the suspended structure 148 can dynamically move up and down like in a piston-like arrangement with respect to a stationary structure.

Figure 3:
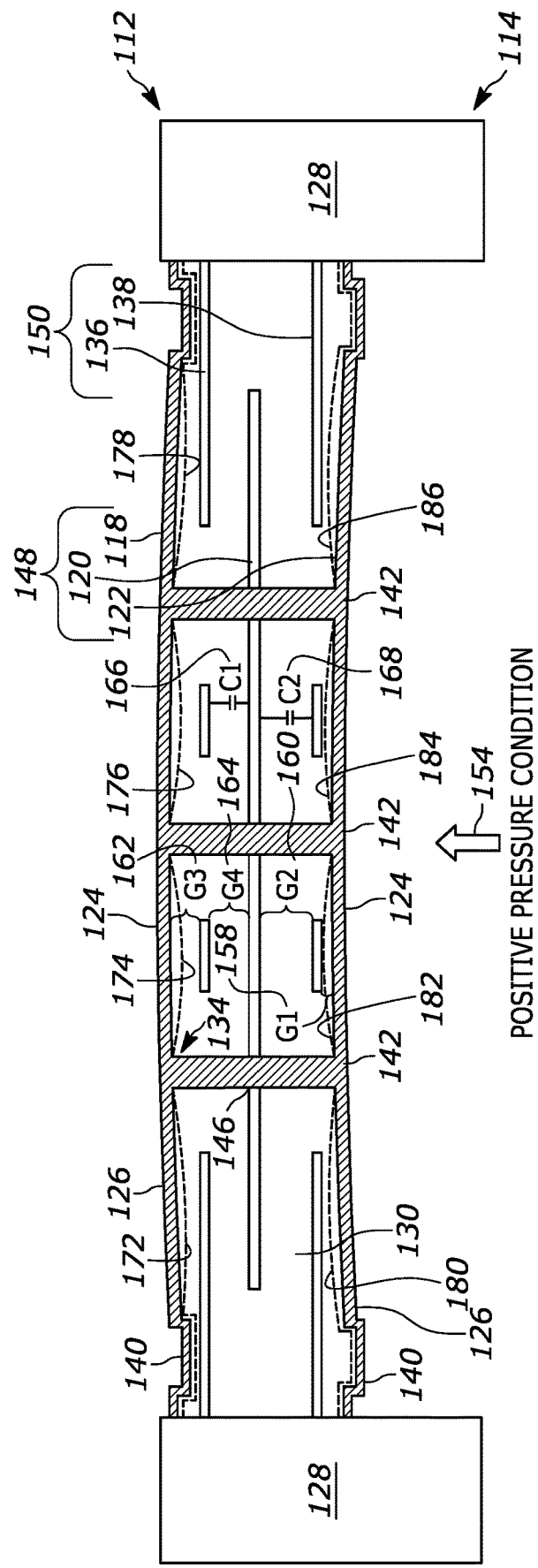
FIG. 3 is a side cross-sectional view of a MEMS acoustic sensor, in a position pressure condition, in accordance with an illustrative embodiment.
Figure 4:
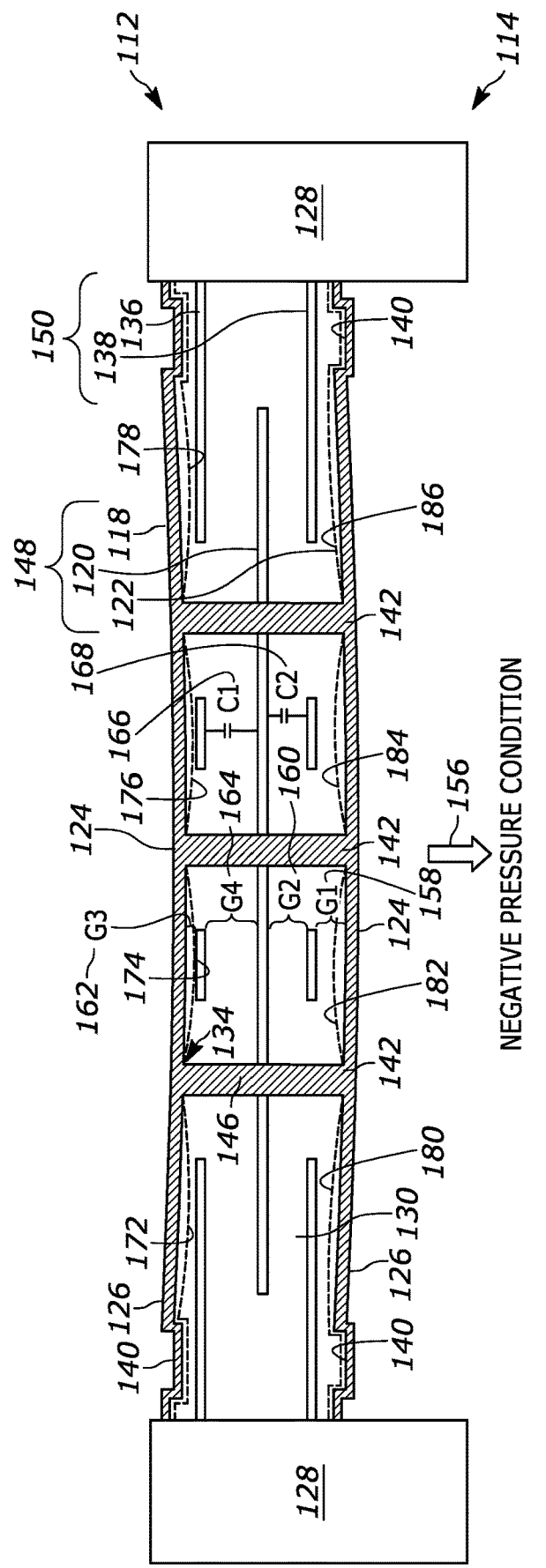
FIG. 4 is a side cross-sectional view of a MEMS acoustic sensor, in a negative pressure condition, in accordance with an illustrative embodiment.

In FIG. 2-4, the transducer 116 is shown at an atmospheric pressure condition with arrow 152, a positive pressure condition with arrow 154 and a negative pressure condition with arrow 156.

As shown in FIG. 2, during an atmospheric pressure condition (or at rest), shown as arrow 152, the transducer 116 includes a first gap 158 that is about half or less of a second gap 160, wherein the first gap 158 is defined as a distance from the bottom electrode 138 to the bottom diaphragm 122 and the second gap 160 is defined as a distance between the bottom electrode 138 and the central electrode 120. Continuing, a third gap 162 is about half or less of a fourth gap 164, wherein the third gap 162 is defined as a distance from the top electrode 136 to the top diaphragm 118 and the fourth gap 164 is defined as a distance between the top electrode 136 and the central electrode 120.

In FIGS. 2-4, the top diaphragm 118 includes a first, second, third and fourth lower section 172, 174, 176 and 178, respectively, shown in dashed line, between a left wall 128 and pillar 142, pillar to adjacent pillar, pillar to next adjacent pillar, and pillar 142 to a right wall 128, moving from left to right. These lower sections 172, 174, 176 and 178, in dashed line, are examples of localized deformations at an instant in time. They are localized and curve inwardly, due to the vacuum or low-pressure cavity 130. Likewise, the bottom diaphragm 122 includes a first, second, third and fourth upper sections 180, 182, 184 and 186, respectively, located between a left wall 128 and pillar 142, pillar to adjacent pillar, pillar to adjacent next pillar, and pillar 142 to a right wall 128, moving from left to right. These upper sections 180, 182, 184 and 186, in dashed line, are examples of localized curved inwardly deformations at an instant in time. They are localized and curve inwardly, due to the vacuum or low-pressure cavity 130. In practice, these deformations are substantially consistent (or permanent), if there are no pressure leaks, and can also vary due to changes and fluctuations in ambient pressure and sound pressure. In FIGS. 2-4, in practice, the first and third gaps 158 and 162, will change due to such localized deformations, as shown by second section 174 of the top diaphragm 118 and the second section 182 of the bottom diaphragm 122.

In FIG. 3, a positive (upward) acoustic pressure condition, shown by arrow 154, is illustrated. The suspended structure 148 in FIG. 3 is moved or deflected upwardly, with the bottom diaphragm 122 curved and moved upwardly, causing the first gap 158 to decrease and the second gap 160 to increase. The top diaphragm 118 is also shown curved and moved upwardly, while the central electrode 120 remains substantially planar. Note in FIGS. 3 and 4, the suspended structure 148 is constructed to allow movement, deflecting and/or floating when exposed to sound pressures, while the stationary structure 150 remains independent and stationary.

In more detail, in FIG. 3, the suspended structure 148 (the bottom diaphragm 122, the central electrode 120 and the top diaphragm 118) moves up, causing the first 158 and fourth gaps 164 to decrease and the second 160 and third gaps 162 to increase.

In further detail in FIG. 3, due to the bottom diaphragm 122 moving up, a first capacitance (C1) 166 between the top electrode 136 and central electrode 120 increases and a second capacitance (C2) 168 between the bottom electrode 138 and the central electrode 120 decreases. Note, the capacitance change is inversely proportional to gap change. In the instance of a positive acoustic pressure condition, the first capacitance C1 166 (0 or 1) and the second capacitance C2 168 (0 or 1) can be fed to an IC 115 to process sound. The capacitance signal out of MEMS sensor 112 is analog and substantially continuous. The IC 115 can convert the capacitance change, thus voltage change to digital if desired.

In the event of an excessive (high) positive pressure condition in FIG. 3, the first gap 158 approaches and can become zero, wherein a middle portion of the bottom diaphragm 122 and the bottom electrode 138 can make physical contact, which prevents the bottom electrode 138, top electrode 136 and the central electrode 120 from making contact, due to the fourth gap 164 being greater than the first gap 158.

Now moving to FIG. 4, a negative (downward) acoustic pressure condition (shown as arrow 156) is illustrated. The suspended structure 148 in FIG. 4 is moved or deflected downwardly, with the bottom diaphragm 122 curved and moved downwardly. Since the bottom diaphragm 122 moves down, the first gap 158 is increased and the second gap 160 is decreased. The top diaphragm 118 is also shown curved and moved downwardly, while the central electrode 120 remains substantially planar. Note in FIGS. 3 and 4, the suspended structure 148 is capable of moving, deflecting or floating when exposed to sound pressures, while the stationary structure 150 remains independent and stationary.

In more detail, when a negative acoustic pressure condition occurs, the suspended structure 148 moves down causing the first 158 and fourth gaps 164 to increase and the second 160 and third gaps 162 to decrease.

In further detail in FIG. 4, due to the top and bottom diaphragm 118 and 122 movement down, the first capacitance (C1) 166 between the top electrode 136 and central electrode 120 decreases and the second capacitance (C2) 168 between the bottom electrode 138 and the central electrode 120 increases. The capacitance change is inversely proportional to gap change. In the instance of a negative acoustic pressure condition, the first and second capacitance 166 and 168 values can be fed to the IC 115, to process sound.

In the event of an excessive negative pressure condition in FIG. 4, in the event the third gap 162 goes to zero, a middle portion of the top diaphragm 118 and the top electrode 136 make physical contact, which prevents the bottom electrode 138 and the central electrode 120 from making contact, due to the third gap 162 being greater than the second gap 160. Advantageously, this construction can prevent an undesirable "pull in" from occurring. In FIG. 4, an example of a gap approaching zero, is illustrated by the lower section 174 in dashed-line of the top diaphragm 118 being spaced immediately adjacent to the top electrode 136.

In one embodiment, the transducer includes a suspended structure 148 defined by the top diaphragm 118, the central electrode 120 and the bottom diaphragm 122 being suspended about a stationary structure defined as the top and bottom electrodes 136 and 138, at ambient pressure and when exposed to sound pressures. This construction can provide enhanced sensitivity and sound quality in a dynamic environment and a robust structure.

As should be understood by those skilled in the art, various modifications can be made to address certain use cases in connection with this disclosure. For example, various illustrative embodiments can include; (i) The support structure 114 being generally tubular with the diaphragms and central electrode being complementarily configured to fit and move up or down therein, and the diaphragms and central electrode can be generally disc shaped (or circular) and in a parallel arrangement, to allow diaphragm movement in a piston-like arrangement with respect to the tubular support structure. (ii) The top and bottom diaphragms 118 and 120 can be disc shaped and have pillars that have local deformations between adjacent pillars and between pillars and a wall, in one use case. (iii) The top and bottom diaphragms 118 and 120 can be disc shaped with a corrugation region 140 around a periphery. (iv) The central electrode 120 can include a substrate with a top and bottom electrode on either side, in one embodiment. (v) The top diaphragm 118 and bottom diaphragm 122 can include a conductive layer on one or both sides, in another use case. (vii) The number of pillars can vary widely depending on use case.

The subject matter described herein sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A MEMS die for an acoustic sensor assembly, the die comprising:

a top diaphragm, a central electrode and a bottom diaphragm; the top diaphragm and the bottom diaphragm including a middle portion and a peripheral portion extending to and coupled to a support structure, forming a low pressure cavity; the central electrode extends along and between the middle portions of the top diaphragm and the bottom diaphragm and includes a termination point free from contacting the support structure;

the central electrode is connected to the top diaphragm and the bottom diaphragm by a pillar structure;

a top electrode disposed between the top diaphragm and central electrode and a bottom electrode disposed between the bottom diaphragm and central electrode each coupled to a wall of the housing; and a first gap that is about half or less of a second gap, wherein the first gap is defined as a distance from the bottom electrode to the bottom diaphragm and the second gap is defined as a distance between the bottom electrode and the central electrode, wherein in the event of a positive acoustic pressure condition or a negative acoustic pressure condition, the top diaphragm, the bottom diaphragm and central electrode move up or down together, while the top electrode and the bottom electrode remain substantially stationary.

2. The MEMS die of claim 1 wherein the peripheral portions of the top diaphragm and the bottom diaphragm include an adjacent corrugation region.

3. The MEMS die of claim 1 wherein the pillar structure includes a plurality of pillars and the central electrode has holes configured and aligned to allow the plurality of pillars to extend therethrough and also be connected to the central electrode.

4. The MEMS die of claim 1 wherein the central electrode is constructed to move with the top diaphragm and the bottom diaphragm.

5. The MEMS die of claim 1 wherein in the event of a positive acoustic pressure condition, the bottom diaphragm moves in a first direction causing the first gap to decrease and the second gap to increase.

6. The MEMS die of claim 1 wherein in the event of a negative acoustic pressure condition, the bottom diaphragm moves in a second direction opposite the first direction causing the first gap to increase and the second gap to decrease.

7. The MEMS die of claim 1 wherein the transducer includes:
a third gap that is about half or less of a fourth gap, wherein the third gap is defined as a distance from the top electrode to the top diaphragm and the fourth gap is defined as a distance between the top electrode and the central electrode, during an atmospheric pressure condition.

8. The MEMS die of claim 7 wherein
in the event of a positive acoustic pressure condition, the bottom diaphragm, the central electrode and the top diaphragm move up causing the first and fourth gaps to decrease and the second and third gaps to increase, and
in the event of a negative acoustic pressure condition, the bottom diaphragm, the central electrode and the top diaphragm move down causing the first and fourth gaps to increase and the second and third gaps to decrease.

9. The MEMS die of claim 1 wherein
in the event of a positive acoustic pressure condition, the bottom diaphragm moves in a first direction, and a first capacitance (C1) between the top electrode and central electrode increases and a second capacitance (C2) between the bottom electrode and central electrode decreases, and
in the event of negative acoustic pressure condition, the top and bottom diaphragm moves in a second direction opposite the first direction, and a first capacitance (C1) between the top electrode and the central electrode decreases and a second capacitance (C2) between the bottom electrode and the central electrode increases.

10. The MEMS die of claim 8 wherein in the event of a positive pressure condition, if the first gap becomes zero, a center portion of the bottom diaphragm and the bottom electrode make physical contact, which prevents the top electrode and the central electrode from making contact, due to a fourth gap being greater than a first gap.

11. The MEMS die of claim 8 wherein in the event of a negative pressure condition, if the third gap goes to zero, a center portion of the top diaphragm and the top electrode make physical contact, which prevents the bottom electrode and the central electrode from making contact, due to the third gap being greater than the second gap.

12. The MEMS dies of claim 1 wherein the transducer includes a suspended structure defined by the top diaphragm, the central electrode and the bottom diaphragm being suspended about a stationary structure defined as the top and bottom electrodes, at ambient pressure and when exposed to sound pressures.

13. An acoustic sensor assembly comprising:
a base having a host-device interface with a plurality of contacts and a lid mounted on the base to form a housing;
a MEMS die disposed in the housing and acoustically coupled to a sound port of the assembly housing, the MEMS die including
a top diaphragm, a central electrode, and a bottom diaphragm, the top diaphragm and the bottom diaphragm including a peripheral portion extending to and coupled with a support structure, forming a low pressure cavity; the central electrode extends along and between middle portions of the top diaphragm and the bottom diaphragm and includes a termination point free from contacting the support structure; the central electrode is connected to the top diaphragm and the bottom diaphragm by a pillar structure;
a corrugation on the peripheral portions of the top diaphragm and the bottom diaphragm; and
a top electrode disposed between the top diaphragm and central electrode and a bottom electrode disposed between the bottom diaphragm and central electrode each coupled to the support structure, wherein in the event of a positive acoustic pressure condition or a negative acoustic pressure condition, the top diaphragm, the bottom diaphragm and central electrode move up or down together, while the top electrode and the bottom electrode remain substantially stationary; and
an integrated circuit disposed in the housing, the integrated circuit electrically coupled to the transducer and to contacts of the host-device interface.

14. The acoustic sensor assembly of claim 13 wherein the top diaphragm, the central electrode and the bottom diaphragm form a structure suspended about the top and bottom electrodes, at ambient pressure and when exposed to sound pressures.

15. A MEMS sensor assembly comprising:
a housing having a host-device interface with a plurality of contacts;

an electrical circuit disposed in the housing and electrically coupled to the contacts; and a MEMS die disposed in the housing and electrically coupled to the electrical circuit, the MEMS die comprising:

a suspension structure including a first diaphragm, a second diaphragm spaced apart from the first diaphragm, a central electrode disposed between the first diaphragm and the second diaphragm, and a pillar structure interconnecting the first diaphragm, the central electrode and the second diaphragm, a low pressure cavity between the first and second diaphragms;

peripheral portions of the first and second diaphragms coupled to a support structure, the central electrode not coupled to the support structure;

a first electrode coupled to the support structure and disposed between the first diaphragm and the central electrode; and a second electrode coupled to the support structure and disposed between the second diaphragm and the central electrode, wherein the suspension structure is movable relative to the first electrode and the second electrode, and wherein a gap between the first diaphragm and the first electrode and a gap between the first electrode and the central electrode are configured to prevent the central electrode from contacting the second electrode when the first diaphragm contacts the first electrode.

16. The MEMS sensor of claim 15 further comprising a corrugation on the peripheral portions of the first diaphragm and the second diaphragm.

17. The MEMS sensor of claim 15, wherein a gap between the second diaphragm and the second electrode and a gap between the second electrode and the central electrode are configured to prevent the central electrode from contacting the first electrode when the second diaphragm contacts the first electrode.

18. The MEMS sensor of claim 15 is a microphone.

* * * * *